(12) United States Patent
Sekine et al.

(10) Patent No.: US 9,703,015 B2
(45) Date of Patent: Jul. 11, 2017

(54) PHOTOMASK, METHOD OF MANUFACTURING OPTICAL ELEMENT ARRAY, OPTICAL ELEMENT ARRAY

(71) Applicant: CANON KABUSHIKI KAISHA, Tokyo (JP)

(72) Inventors: Yasuhiro Sekine, Yokohama (JP); Mariko Furuta, Yokohama (JP); Jun Iwata, Kawasaki (JP); Kyouhei Watanabe, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 37 days.

(21) Appl. No.: 14/727,111

(22) Filed: Jun. 1, 2015

(65) Prior Publication Data
US 2015/0346393 A1 Dec. 3, 2015

(30) Foreign Application Priority Data

Jun. 3, 2014 (JP) ................. 2014-115281
Apr. 20, 2015 (JP) ................. 2015-086265

(51) Int. Cl.
*G02B 27/10* (2006.01)
*G03F 7/00* (2006.01)
(Continued)

(52) U.S. Cl.
CPC ......... *G02B 3/0037* (2013.01); *G02B 3/0012* (2013.01); *G02B 27/0927* (2013.01);
(Continued)

(58) Field of Classification Search
CPC .... G02B 3/0012; G02B 3/0037; G02B 3/005; G02B 3/0056; G02B 3/0062;
(Continued)

(56) References Cited

U.S. PATENT DOCUMENTS

| | | |
|---|---|---|
| 4,411,493 A | 10/1983 | Miller |
| 5,731,899 A | 3/1998 | Meyers |

(Continued)

FOREIGN PATENT DOCUMENTS

| | | |
|---|---|---|
| CN | 1591182 A | 3/2005 |
| JP | 2005-258349 A | 9/2005 |
| JP | 2007-335723 A | 12/2007 |

*Primary Examiner* — Loha Ben
(74) *Attorney, Agent, or Firm* — Canon U.S.A. Inc., IP Division

(57) ABSTRACT

A photomask for an optical element array includes first and second optical elements. A light transmission rate distribution includes a first area where the first optical element is to be formed, a second area where the second optical element is to be formed, and a third area between the first and second areas, has a first light transmission rate at an end portion of the first area. A second light transmission rate is higher than the first light transmission rate at another end portion. A third light transmission rate at an end portion corresponds to a boundary between the second and third areas. A fourth light transmission rate is higher than the third light transmission rate at another end portion of the second area. The light transmission rate distribution along a first direction is higher than a segment connecting the second and third light transmission rates in the third area.

12 Claims, 11 Drawing Sheets

(51) Int. Cl.
 *G02B 3/00* (2006.01)
 *G03F 1/50* (2012.01)
 *G02B 27/09* (2006.01)
(52) U.S. Cl.
 CPC .............. *G03F 1/50* (2013.01); *G03F 7/0005* (2013.01); *G02B 3/005* (2013.01); *G02B 3/0056* (2013.01); *G02B 27/10* (2013.01)
(58) Field of Classification Search
 CPC ... G02B 27/0927; G02B 27/10; G03F 7/0005; G03F 7/70091; G03F 7/70125; G03F 7/70141; G03F 7/70191; G03F 7/70308; G03F 1/50
 USPC ................ 359/619, 621, 628; 430/319, 321; 250/208.1; 396/556; 355/53, 71; 235/458
 See application file for complete search history.

(56) References Cited

U.S. PATENT DOCUMENTS

| | | | |
|---|---|---|---|
| 5,973,841 A * | 10/1999 | Watanabe | H04N 5/7441 348/E5.141 |
| 7,307,790 B1 | 12/2007 | Raymond | |
| 8,908,151 B2 * | 12/2014 | Muramatsu | 355/53 |
| 2008/0112056 A1 | 5/2008 | Raymond | |

* cited by examiner

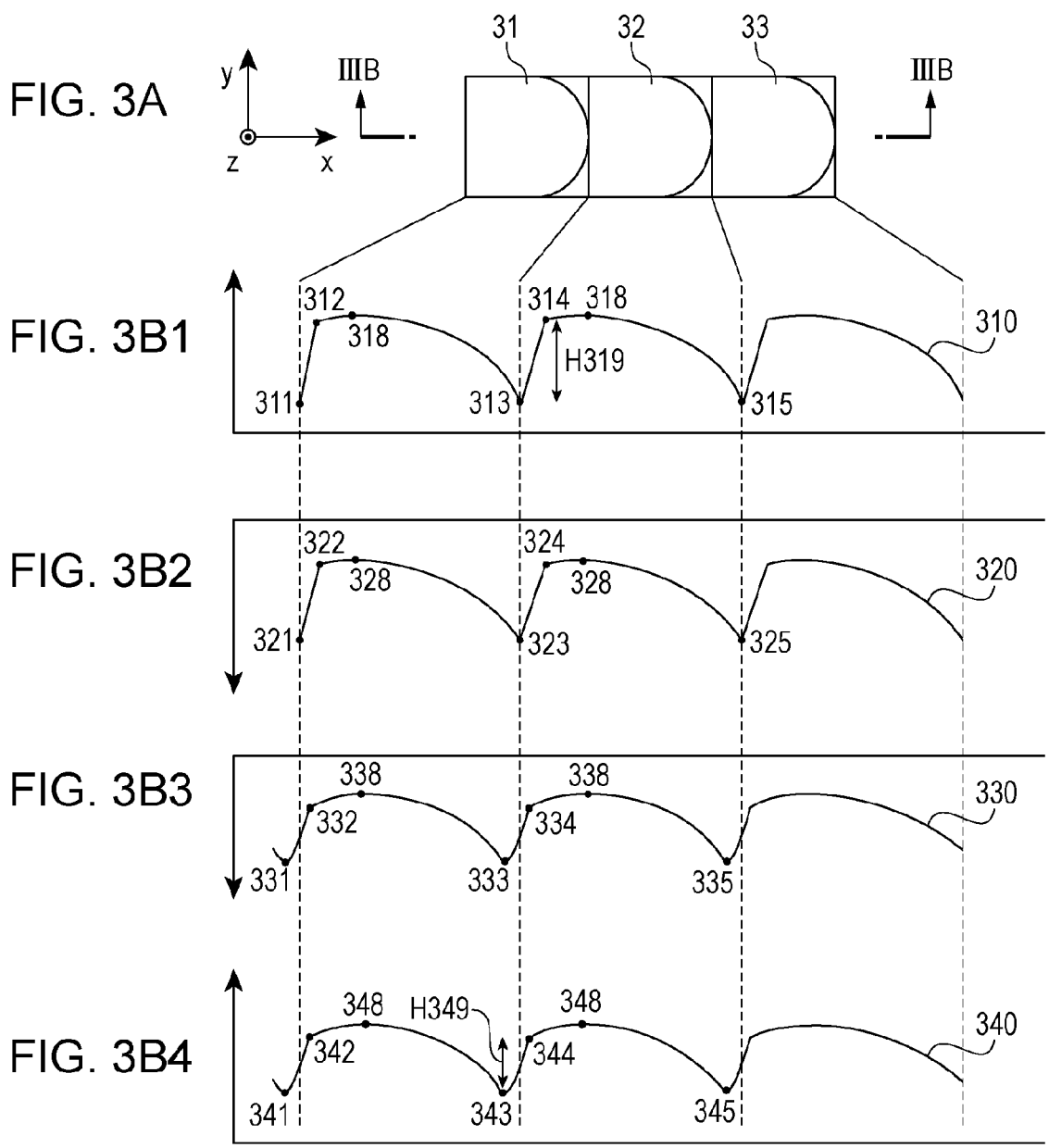

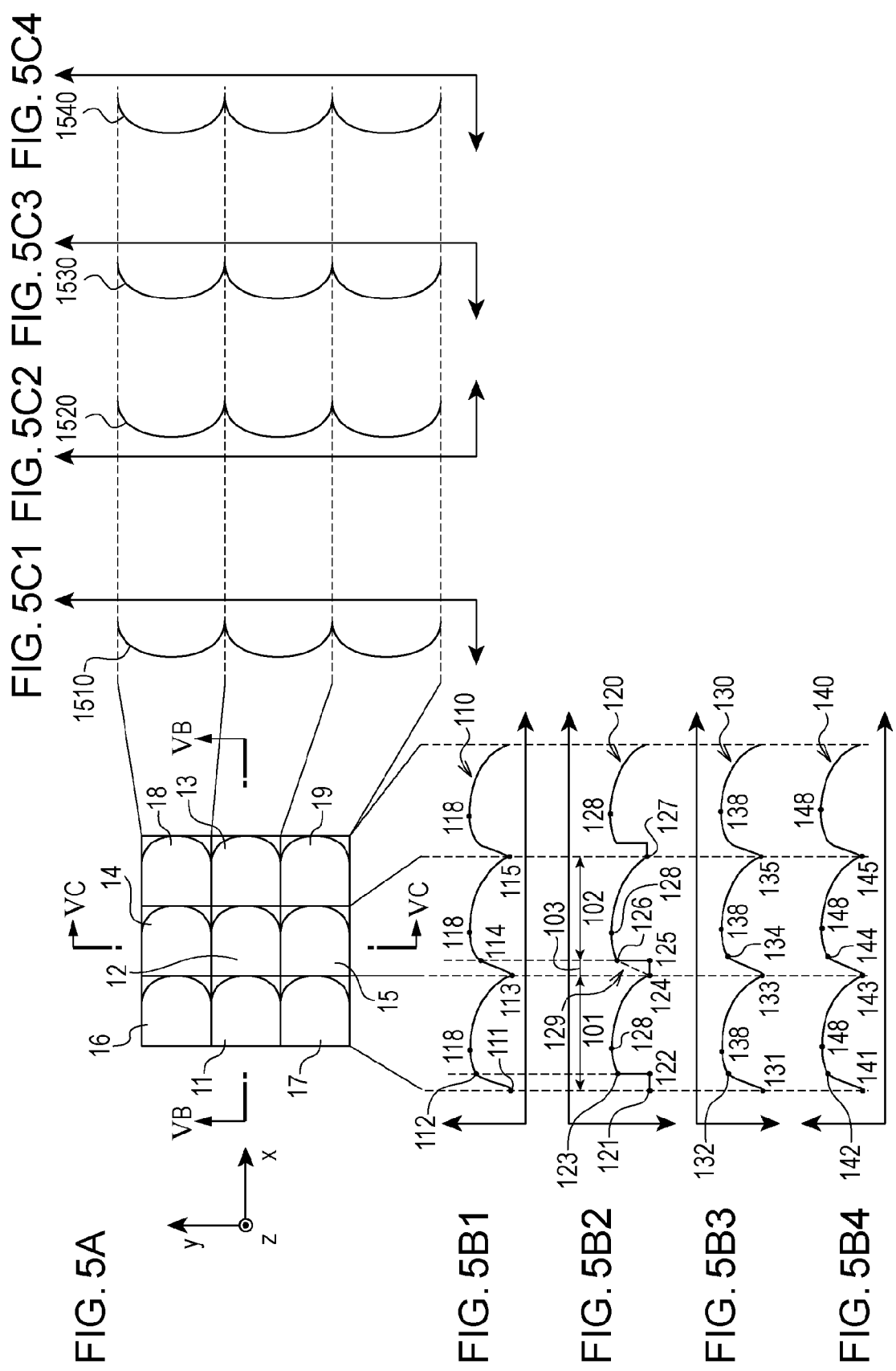

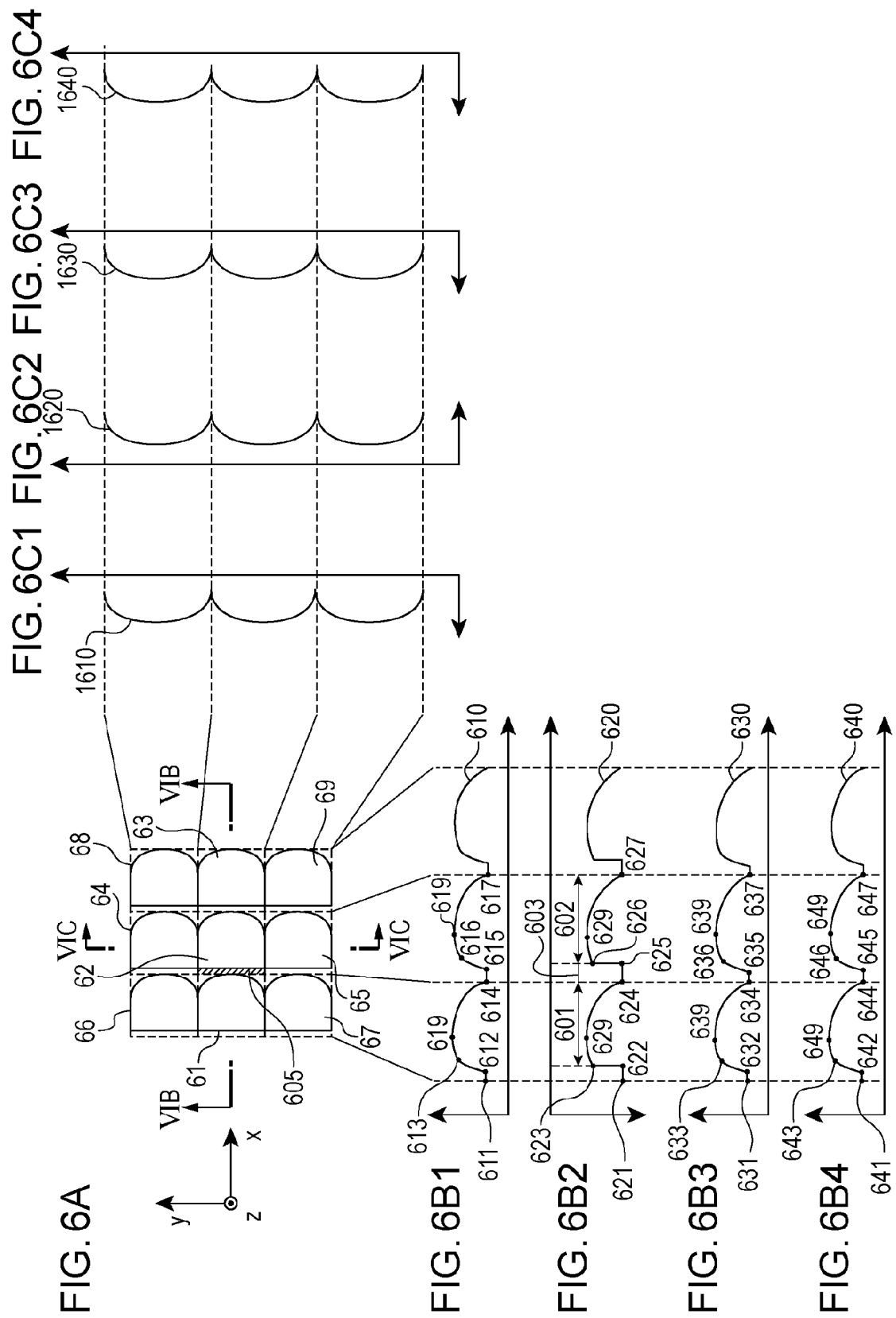

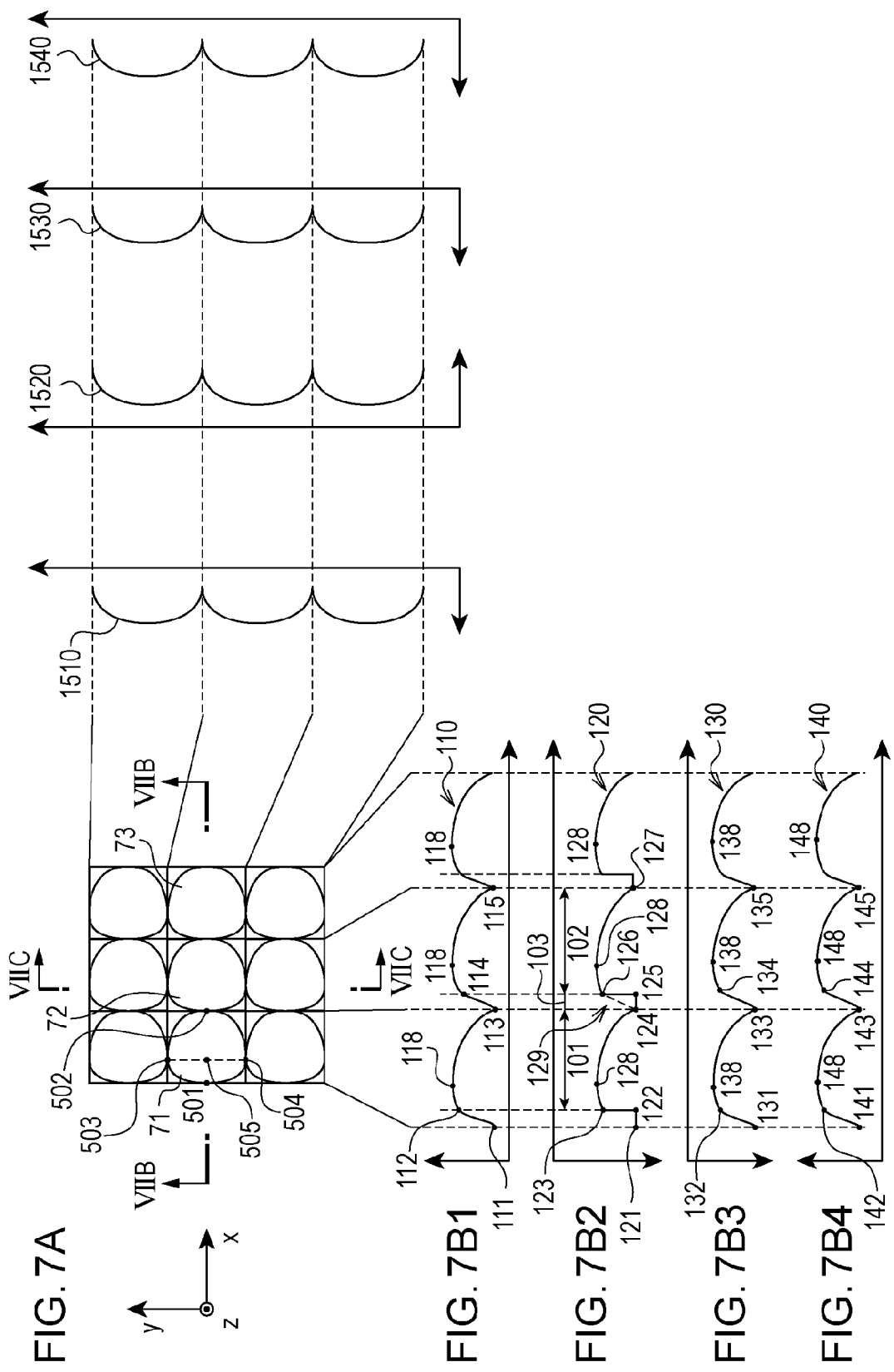

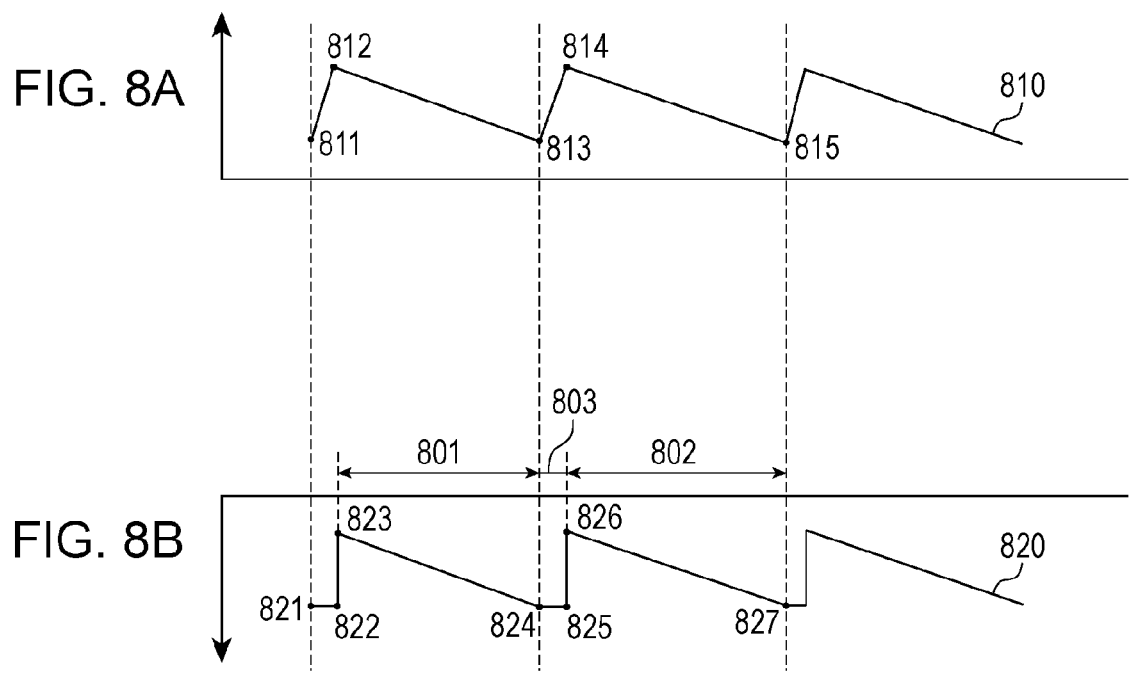

PHOTOMASK, METHOD OF MANUFACTURING OPTICAL ELEMENT ARRAY, OPTICAL ELEMENT ARRAY

BACKGROUND OF THE INVENTION

Field of the Invention

This disclosure relates to manufacture of photomasks and, specifically, to manufacture of photomasks for forming optical elements.

Description of the Related Art

A micro lens is known as an optical element for an image pickup apparatus. In the image pickup apparatus, since an incident angle of light incident on a peripheral portion is larger than an incident angle of light incident on a center portion in an image pickup area in which photoelectric conversion elements are arrayed, light condensing characteristics of the micro lens located in the peripheral portion thereof may be lowered in comparison with that in the center portion. Japanese Patent Laid-Open No. 2007-335723 discloses a configuration in which tear drop type micro lenses are provided in a peripheral portion of a hemispherical micro lens located in a center portion of an image pickup area to reduce a loss of light condensing characteristics of the micro lens in the peripheral portion thereof.

Japanese Patent Laid-Open No. 2005-258349 discloses a method of forming a micro lens having a given shape by using a photomask having an area coverage modulation.

When forming a micro lens array (optical element array) having a tear drop shape, which is not a hemispherical shape as disclosed in Japanese Patent Laid-Open No. 2007-335723, using the method disclosed in Japanese Patent Laid-Open No. 2005-258349 is conceivable. However, the present inventors have found that the optical elements having a desired shape cannot be obtained by the method disclosed in Japanese Patent Laid-Open No. 2005-258349 at portions where the optical elements having a non-hemispherical shape abut each other.

Accordingly, this disclosure is intended to provide a photomask which contributes to achieving an optical element having a desired shape and a method of manufacturing an optical element array.

SUMMARY OF THE INVENTION

This disclosure provides a photomask for an optical element array including: a first optical element having a bottom surface on a first surface including a first direction and a second direction that intersects the first direction; and a second optical element having a bottom surface on the first surface and arranged so as to abut on the first optical element along the first direction, wherein a light transmission rate distribution of the photomask along the first direction includes a first area in which the first optical element is to be formed, a second area in which the second optical element is to be formed, and a third area provided between the first area and the second area, wherein the light transmission rate distribution of the photomask along the first direction includes: a first light transmission rate at an end portion of the first area; a second light transmission rate having a light transmission rate higher than the first light transmission rate at another end portion, which corresponds to a boundary between the first area and the third area on a side opposite to the end portion; a third light transmission rate at an end portion, which corresponds to a boundary between the second area and the third area; and a fourth light transmission rate having a light transmission rate higher than the third light transmission rate at another end portion of the second area on a side opposite to the end portion, and wherein the light transmission rate distribution of the photomask along the first direction has a light transmission rate higher than a segment connecting the second light transmission rate and the third light transmission rate in the third area.

Further features of the present invention will become apparent from the following description of exemplary embodiments with reference to the attached drawings.

BRIEF DESCRIPTION OF THE DRAWINGS

FIG. 1A is a plan view for explaining optical elements of a first embodiment.

FIGS. 1B1 to 1B4, 1C1 to 1C4, and 1D are cross-sectional views of the optical elements of the first embodiment.

FIG. 3A is an explanatory plan view illustrating the optical elements of the first embodiment.

FIG. 3B1 to 3B4 are explanatory cross-sectional views of the optical elements of the first embodiment.

FIG. 5A is an explanatory plan view illustrating optical elements of a second embodiment.

FIGS. 5B1 to 5B4 and 5C1 to 5C4 are explanatory cross-sectional views of the optical elements of the second embodiment.

FIG. 6A is an explanatory plan view illustrating optical elements of a third embodiment.

FIGS. 6B1 to 6B4 and 6C1 to 6C4 are explanatory cross-sectional views of the optical elements of the third embodiment.

FIG. 7A is an explanatory plan view illustrating optical elements of a fourth embodiment.

FIGS. 7B1 to 7B4 and 7C1 to 7C4 are explanatory cross-sectional views of the optical elements of the fourth embodiment.

FIGS. 8A and 8B are schematic cross-sectional views of the optical element of a fifth embodiment.

DESCRIPTION OF THE EMBODIMENTS

A photomask for an optical element array of this disclosure will be described with reference to a plurality of embodiments. The embodiments may be modified and may be combined as needed. The optical element array formed by the photomask for the optical element array of this disclosure is applicable to a photoelectric conversion apparatus, a display apparatus, an image pickup system and a display system using these apparatuses.

The following description will be given with reference to an X-axis direction (first direction), a Y-axis direction (second direction), and a Z-axis direction (third direction) passing through a center O of the optical element array. However, the first direction may be a direction inclined by an angle $\theta 1$ ($\theta 1 > 0$) from the X-axis direction, for example. In other words, a given direction of radiation from a center to an outer periphery of an area (array area) in which the optical elements are arrayed may be defined as the first direction, and a direction intersecting the first direction may be defined as the second direction. However, in the following description, the optical element array is provided along a plane including the first direction and the second direction. In the following description, description of the corresponding drawings is omitted as needed.

First Embodiment

Figure 1:
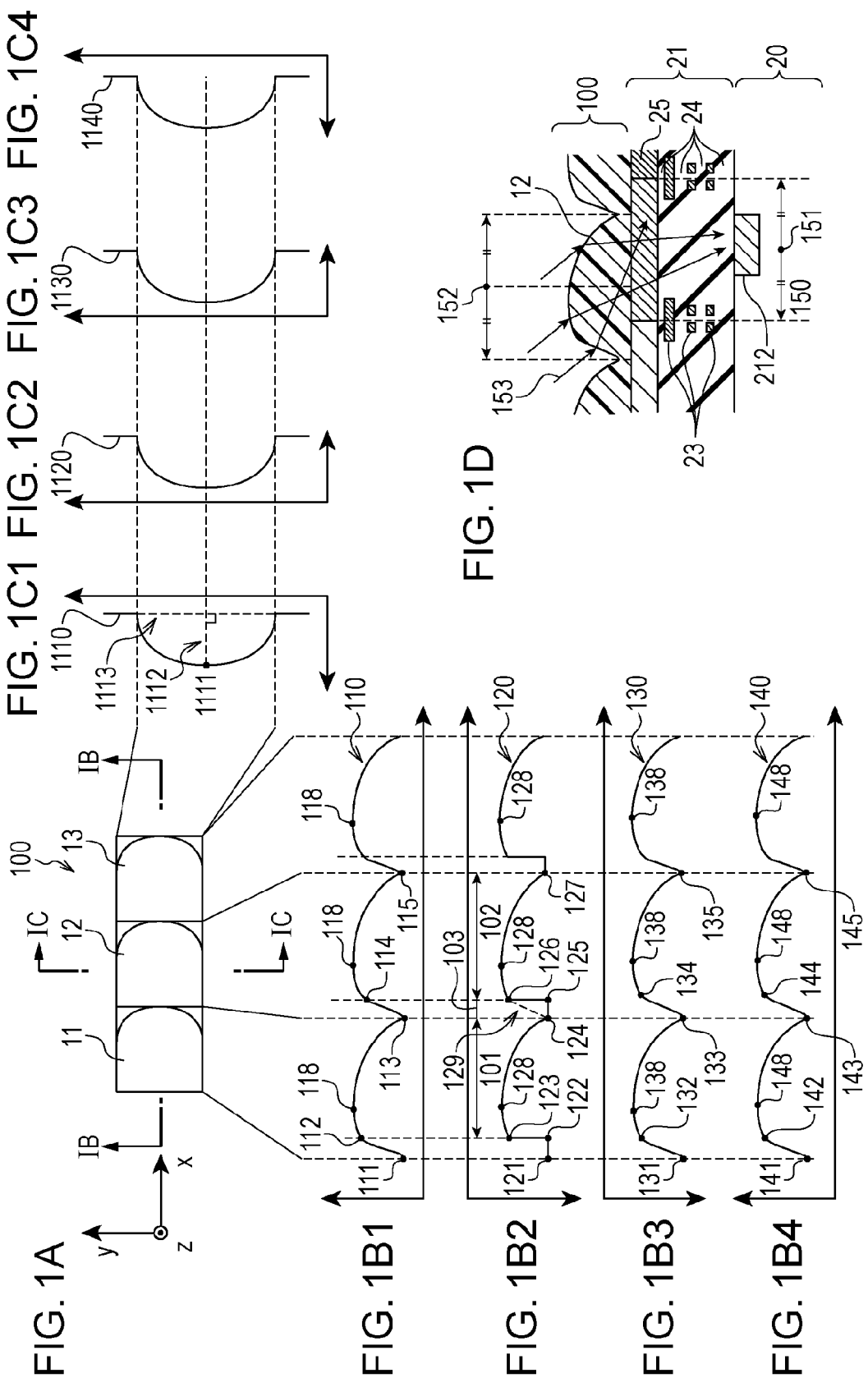

As a first embodiment, an example in which a plurality of micro lenses are arranged one dimensionally as the optical element array will be described with reference to FIG. 1A to FIG. 4D. FIGS. 1A to 1D are drawings illustrating a shape and a distribution relating to an optical element array 100. FIGS. 1A to 1D illustrate portions of the optical element array 100, where three optical elements, namely, an optical element 11, an optical element 12, and an optical element 13 are arranged along a Y-axis direction. FIG. 1A is a schematic plan view illustrating an orthogonal projection image of the optical element array 100. The orthogonal projection image is a drawing of a projection of the optical element array 100 on a plane including an X-axis and a Y-axis.

Figure 2:
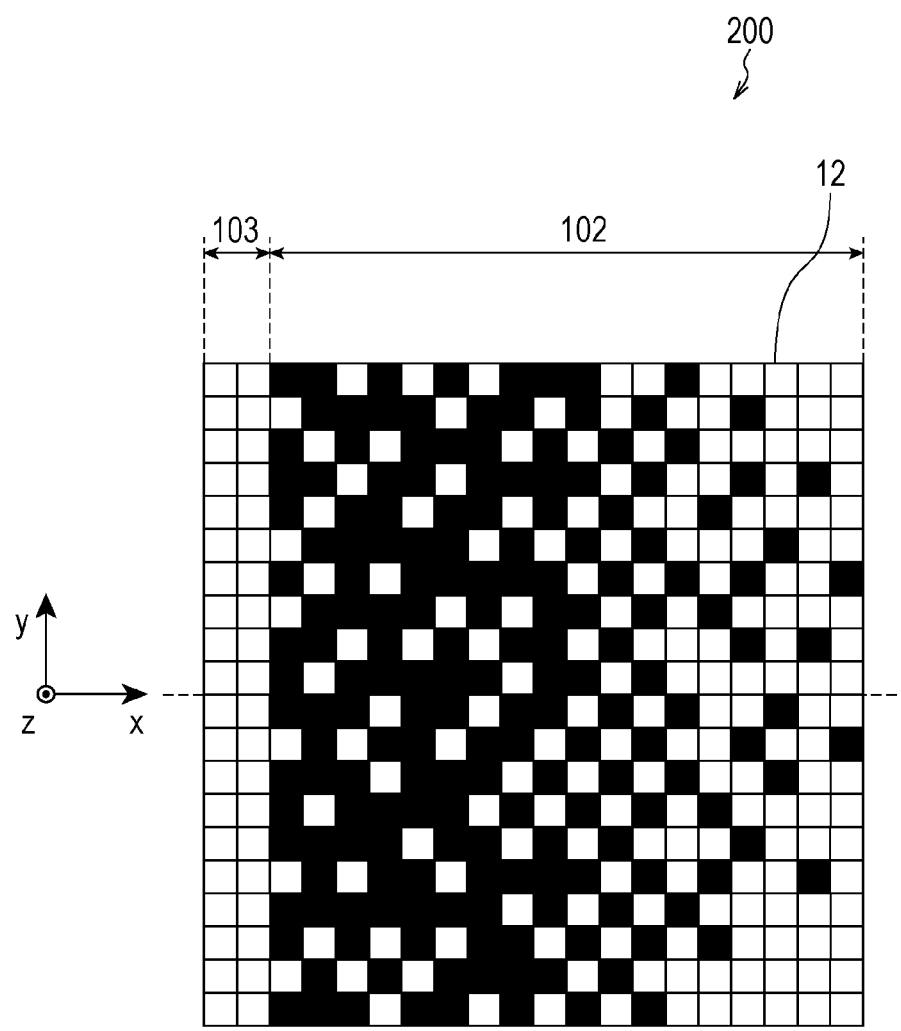
FIG. 2 is a schematic plan view for explaining a photomask of the first embodiment.

FIG. 1B1 is a drawing illustrating a design shape 110 of the optical element array taken along a line IB-IB in FIG. 1A. The term "design shape" in this specification is an ideal shape at the time of designing. FIG. 1B2 is a drawing illustrating a light transmission rate distribution 120 of a photomask on the basis of the design illustrated in FIG. 1B1. FIG. 1B3 is a drawing illustrating a light intensity distribution 130 in an exposed member when the photomask having the light transmission rate distribution illustrated in FIG. 1B2. FIG. 1B4 is a drawing (schematic cross sectional view) illustrating a shape 140 of the optical element array at a position indicated by the line IB-IB in FIG. 1A.

FIG. 1O1 is a drawing illustrating a design shape 1110 of the optical element array taken along a line IC-IC in FIG. 1A. FIG. 1C2 is a drawing illustrating a light transmission rate distribution 1120 of the photomask on the basis of the design illustrated in FIG. 1O1. FIG. 1C3 is a drawing illustrating a light intensity distribution 1130 in an exposed plane when the photomask having the light transmission rate distribution illustrated in FIG. 1C2. FIG. 1C4 is a drawing (schematic cross sectional view) illustrating a shape 1140 of the optical element array at a position indicated by the line IC-IC in FIG. 1A. In the following description, points indicate a position in the X-axis direction or the Y-axis direction, a height of the design shape, a light transmission rate, a light intensity, and a height of the shape.

The photomask of this embodiment will be described here. The photomask of this embodiment may be any photomask as long as being provided with a continuous gradation change. For example, a gray tone mask, a half tone mask, or an area coverage modulation mask may be used as the photomask of this embodiment. The area coverage modulation mask is a photomask capable of irradiating light having a continuous gradation change by changing a density distribution of dots formed of a light-shielding film having a resolution not higher than a resolution of an exposure apparatus or by hanging the surface area thereof. This embodiment will be described with an example of a positive type photoresist. However, a negative type photoresist is also applicable.

A shape of the optical element will be described by focusing on two optical elements in the optical element array. As illustrated in FIG. 1A, for example, the orthogonal projection image of the optical element 11 has a line symmetry shape with respect to the line IB-IB. However, for example, the orthogonal projection image of the optical element 11 is not line symmetry in segments parallel to the Y-axis direction including the line IC-IC. The cross-sectional shape of the optical element 11 along the line IB-IB corresponds to the shape 140 illustrated in FIG. 1B4. In FIG. 1B4, a vertical axis indicates a height (a size in the Z-axis direction). In FIG. 1B4, the height of the shape 140 increases from a point 141 to a point 142. The height of the shape 140 increases from the point 142 to a point 143 once, and then decreases. Here, a portion from the point 141 to the point 143 corresponds to the optical element 11 (the first optical element). The height of the shape 140 increases from the point 143 to a point 144, and further increases and then decreases in a range from the point 144 to a point 145. Here, a portion from the point 143 to the point 145 corresponds to the optical element 12 (the second optical element). The shape 140 is a portion corresponding to the optical element 13, (the third optical element), and has the same shape in a portion from the point 141 to the point 143 and a portion from the point 143 to the point 145. The optical elements 11 to 13 each have an apex 148.

FIG. 1B1 illustrates the design shape 110 of FIG. 1B4. The vertical axis of FIG. 1B1 indicates the height in the same manner as FIG. 1B4. The design shape 110 corresponds to the shape 140 indicated by FIG. 1B4, and ideally matches the shape 140. The design shape 110 includes points 111 to 115 and apexes 118 corresponding to the points 141 to 145 and the apexes 148 of the shape 140 in FIG. 1B4.

FIG. 1B2 illustrates the transmission rate distribution 120 of the photomask and the vertical axis indicates a transmission rate. The transmission rate distribution 120 may be obtained considering sensitivity of a photosensitive member to be used for reproducing the design shape 110 illustrated in FIG. 1B1. The light transmission rate distribution 120 here includes points 121 to 127 and apexes 128 which correspond to the points 111 to 117 and the apexes 118 of the design shape 110 illustrated in FIG. 1B1. The light transmission rate distribution 120 has a constant light transmission rate from the point 121 to the point 122, and a light transmission rate lower than that at the points 121 and 122 at a point 123. The light transmission rate distribution 120 has a light transmission rate lower than the light transmission rate at the point 123 once in the range from the point 123 to the point 124, and has a light transmission rate higher than that at the point 123 at the point 124. Here, a portion from the point 121 to the point 124 corresponds to the optical element 11 (the first optical element). The light transmission rate distribution 120 in a portion from the point 124 to the point 127 is the same as that in a portion from the point 121 to the point 124. A portion from the point 124 to the point 127 of the light transmission rate distribution 120 corresponds to the optical element 12. The light transmission rate distribution 120 has the same shape at a portion corresponding to the optical element 13 as the portion from the point 121 to the point 124 and a portion from the point 124 to the point 127. The light transmission rate distribution 120 is a portion corresponding to the respective optical elements, and has the apexes 128, which corresponds to the apexes 118 of the design shape 110 illustrated in FIG. 1B1.

As illustrated in FIG. 1B2, the light transmission rate distribution 120 includes a first area 101 in which the optical element 11 is formed, a second area 102 in which the optical element 12 is formed, and a third area 103 provided between the first area 101 and the second area 102. The first area 101 is an area from the point 123 at an end of the first area 101, to the point 124 at another end on the opposite side to the point 123 at a boundary with respect to the third area. The light transmission rate distribution 120 of the first area 101 has the first light transmission rate at the point 123, and a second light transmission rate higher than the first light transmission rate at the point 124. The light transmission rate distribution 120 in the first area 101 indicates that the light transmission rate increases from the first light transmission rate to the second light transmission rate. In this embodiment, the light transmission rate distribution 120 has a light transmission rate decreasing from the first light transmission rate to a point corresponding to the apex 128, and then increasing to the second light transmission rate. However, the light transmission rate may increase from the first light transmission rate to the second light transmission rate at a constant rate. The second area 102 is an area between the point 125 and the point 126 at an end on the boundary with respect to the first area 101 and the point 127 at another end on the opposite side to the point 125 and the point 126. The light transmission rate distribution 120 in the second area 102 has the third light transmission rate at the point 126, and a fourth light transmission rate higher than the third light transmission rate at the point 127. The light transmission rate distribution 120 in the second area 102 indicates that the light transmission rate increases from the third light transmission rate to the fourth light transmission rate. In this embodiment, the light transmission rate distribution 120 has a light transmission rate decreasing from the third light transmission rate to a point corresponding to the apex 128, and then increasing to the fourth light transmission rate. However, the light transmission rate may increase from the third light transmission rate to the fourth light transmission rate at a constant rate. The third area 103 is located between the point 124 (the end on the first area side), which is an end at the boundary with respect to the first area 101 and the point 125 and the point 126 (the end on the second area side) at another end on the boundary with respect to the second area 102. The third area 103 is shorter than the first area 101 in the X-axis direction, and shorter than the second area 102 in the X-axis direction. The light transmission rate distribution 120 in the third area 103 has a light transmission rate equal to or higher than a segment 129, which is a segment connecting the second light transmission rate at the point 124 at one end and the third light transmission rate at the point 126 at the other end. In this embodiment, the light transmission rate distribution 120 in the third area 103 has the same rate as the light transmission rate (the second light transmission rate) at the point 124, like the point 125, for example. This is applicable in the case where an absolute value of a change rate of the light transmission rate in the third area 103 is larger than a change rate (rate) of the light transmission rate in the first area 101 and the second area 102. The light transmission rate in the third area 103 may be changed continuously, may be changed discontinuously, or may be constant as long as the value is higher than that of the segment.

An exposed member obtains a light intensity distribution 130 illustrated in FIG. 1B3 by being exposed by using the photomask having the light transmission rate distribution 120 as described above. The light intensity distribution 130 has the points 131 to 135 and the apexes 138. The points 131 to 135 of the light intensity distribution 130 correspond to the point 121 to 127 of the light transmission rate distribution 120 in FIG. 1B2. Then, the light intensity distribution 130 has the highest light intensity at a point 133, which is a portion corresponding to the boundary between the first area 101 and the third area 103 of the light transmission rate distribution 120. With the photomask in this configuration, the shape between the optical element 11 and the optical element 12 may be formed under control.

FIGS. 3A to 3B4 are drawings corresponding to FIG. 1A to 1B4. FIG. 3A is a schematic plan view illustrating an optical element array 300 corresponding to FIG. 1A. In FIG. 3A, optical elements 31 to 33 corresponding to the optical elements 11 to 13 in FIG. 1A are illustrated. FIG. 3B1 to FIG. 3B4 are drawings corresponding to FIG. 1B1 to FIG. 1B4.

In FIG. 3B1, the height of a design shape 310 increases from a point 311 to a point 312. The design shape 310 has the height decreasing toward a point 313 via the point 318. A portion from the point 313 to the point 315, the design shape 310 has the same shape as that forming the point 311 to the point 313. In FIG. 3B2, a light transmission rate distribution 320 of the photomask for forming the design shape 310 is designed to have the same shape as the design shape 310. However, it is understood that a shape 340 in FIG. 3B4 is different from the design shape 310 of FIG. 3B1 illustrating the shape at the time of designing. For example, in the design shape 310 in FIG. 3B1, a portion from the point 312 to the point 313 has a change rate of the shape smaller than a portion between the point 313 and the point 314. In an area corresponding to the area where portions having different change rates share a border with each other, a reproduction rate is lowered in the shape 340 in FIG. 3B4. The portion from a point 342 to a point 343 of the shape 340 has an inclination smaller than a corresponding portion of the design shape 310, and a portion from the point 343 to a point 344 of the shape 340 has an inclination smaller than a corresponding portion of the design shape 310. In addition, although the design shape 310 in FIG. 3B1 has a height H319 from the point 313 to the point 314, the shape 340 in FIG. 3B4 has a height H349 from the point 343 to the point 344, which is lower than the height H319. The reason is that a light intensity distribution 330 in FIG. 3B3 shows a distribution different from the light transmission rate distribution 320 illustrated in FIG. 3B2.

Figure 4A:
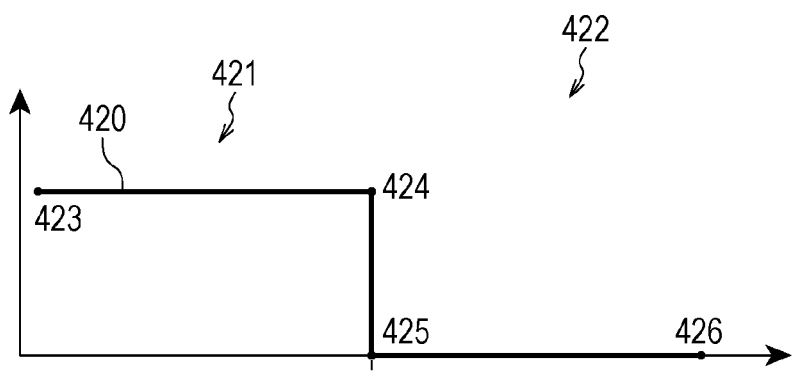
FIGS. 4A to 4D are drawings for explaining the first embodiment.
Figure 4B:
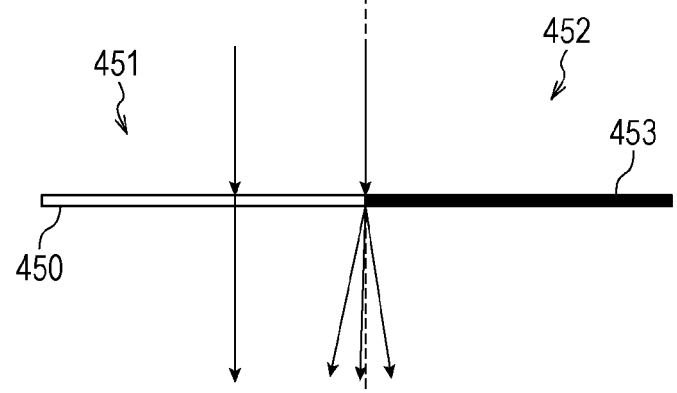
Figure 4C:
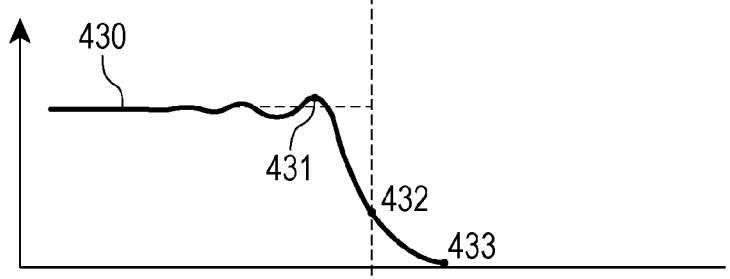
Figure 4D:
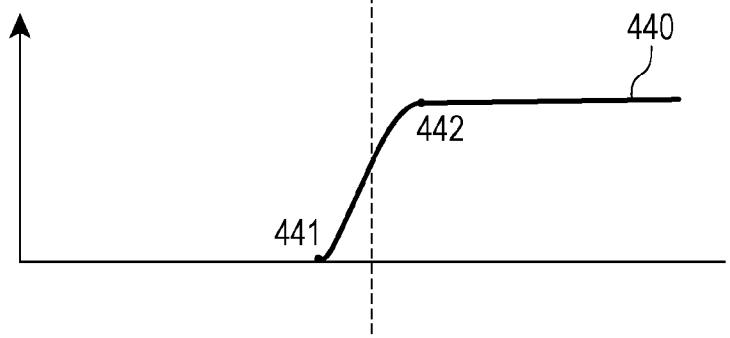

The principle will be described with reference to FIGS. 4A to 4D. FIG. 4A illustrates a light transmission distribution 420 at the time of designing the photomask, and FIG. 4B is a cross-sectional view schematically illustrating a state of exposure at the time when a photomask 450 in FIG. 4A is used. FIG. 4C illustrates a light intensity distribution 430 of the exposed member (a photosensitive member, for example, photoresist) in the state illustrated in FIG. 4B, and FIG. 4D illustrates a shape 440 of the photoresist developed after the exposure. In FIG. 4A, the light transmission distribution 420 has a high light transmission rate from a point 423 to a point 424, and the light transmission rate from the point 425 to a point 426 is zero. In FIG. 4B, the photomask 450 corresponding to the light transmission distribution 420 has an opening 451 and a light-shielding portion 452. A boundary between the opening 451 and the light-shielding portion 452 is a position corresponding to the point 424 (point 425) of the light transmission distribution 420 in FIG. 4A. When light (arrow) enters, the light is diffracted at a boundary between the opening 451 and the light-shielding portion 452 at an end of the light-shielding portion 452. This diffraction causes a decrease in light intensity between a point 431 and a point 432, and an increase in light intensity between the point 432 and a point 433 in the light intensity distribution 430 illustrated in FIG. 4C. As a result of the change in light intensity as described above, a change in shape occurs between a point 441 to a point 442 in the shape 440 of the photoresist illustrated in FIG. 4D. Even though the diffraction occurs, an influence of the diffraction is reduced by using the photomask having the light transmission rate distribution illustrated in FIG. 1B2, so that the shape between the optical element 11 and the optical element 12 is formed under control.

FIGS. 1A to 1D will be described again. FIG. 1C1 to FIG. 1C4 illustrates shapes of cross sections of the optical element 12 taken along the segment IC-IC in FIG. 1A. FIG. 1C1 to FIG. 1C4 are drawings illustrating the shapes and the distribution in the same manner as FIG. 1B1 to FIG. 1B4, and a vertical axes of FIG. 1C1 to FIG. 1C4 indicate the same value. As illustrated by the design shape 1110 in FIG. 1C1, the optical element 12 has a hemispherical shape. A point 1111 is an apex, and the cross section of the optical element 12 along the line IC-IC is line symmetry with respect to a segment 1112 passing through the apex. The segment 1112 is perpendicular to a bottom surface 1113 of the optical element 12. In FIG. 1C2 to FIG. 1C4, the light transmission rate distribution 1120, the light intensity distribution 1130, and the shape 1140 maintaining the design shape 1110.

FIG. 2 illustrates a design data 200 of the photomask on the basis of the light transmission rate distribution illustrated in FIG. 1B2. The design data 200 illustrates a two-dimensional arrangement of a light-shielding member, and corresponds to one optical element 12 in FIG. 1A, and corresponds to the area 103, the area 102 in FIG. 1B2, and FIG. 1C2. In FIG. 2, the portion corresponding to one area is divided into a plurality of cells. These cells are set to have a size smaller than a resolution limit of light having a wavelength used in exposure. The black cells are provided with a light-shielding member, and white cells are opened area having no light-shielding member. The light transmission rate of the photomask can be adjusted by the surface area of the light-shielding member. In the design data of the photomask, the light-shielding member is not provided in the areas corresponding to the area 103 in FIG. 1B2.

The optical elements and the optical element array 100 are formed by being exposed and developed by the photomask on the basis of the design data 200. The optical elements and the optical element array 100 may be applied, for example, to the photoelectric conversion apparatus as illustrated in FIG. 1D. In FIG. 1D, the optical element array 100 is provided above a semiconductor substrate 20 having a photoelectric conversion element 212 with an intermediated layer 21 interposed therebetween. The semiconductor substrate 20 has an element such as transistor in addition to the photoelectric conversion element 212. The intermediated layer 21 includes a plurality of wiring layers 23, a plurality of insulating layers 24 for insulating the wiring layers 23, and a color filter layer 25 for separating color. The intermediated layer 21 may further include an interlayer lens layer and a light-shielding layer. In the photoelectric conversion apparatus, the image pickup area has an area in which the same circuits referred to as a so-called pixels 150 are repeatedly provided. The optical elements of the optical element array 100 may be provided so as to correspond to the pixels 150. Here, in the cross-sectional view in FIG. 1D, a center 151 of the pixel 150 and a center 152 of the optical element are offset and the center of the optical element is located closer to the center of the optical element array 100 than the center of the pixel 150. FIG. 1D illustrates the case where light 153 enters in the photoelectric conversion apparatus as described above. In FIG. 1B4, light entering a portion corresponding to a portion from the point 143 to the point 144 is diffracted more than light entering a portion corresponding to a portion from the point 144 to the point 145 and hence enters an area deviated from a photoelectric conversion element 22, and hence does not contribute to light condensing to the photoelectric conversion apparatus. In contrast, light entering the portion corresponding to the portion from the point 144 to the point 145 is condensed toward the photoelectric conversion element 22. In other words, the shape of the portion corresponding to the portion from the point 144 to the point 145 is desired to be formed specifically under control. According to a photomask 200 illustrated in FIG. 2, the shape of the portion corresponding to the portion from the point 144 to the point 145 can be formed with high degree of reproducibility with respect to the design shape.

Here, the shape is compared with that illustrated in FIG. 3B4 again. The point 343 in FIG. 3B4 illustrating the shape of the optical element array is deviated leftward from the position of the point 313 in FIG. 3B1, which is the design shape of the optical element array. H349 in FIG. 3B4 is smaller than H319 in FIG. 3B1. In other words, the position in the height direction is deviated upward. In contrast, in FIG. 1B4, it is understood that the position of the point 143 substantially matches the position of a point 113 in the design shape in the FIG. 1B1, and the area from the point 142 to the point 143 is formed with high degree of reproducibility with respect to the design shape. Examples will be described further in detail with reference to FIG. 1A to FIG. 1C4. In the case where the optical element array is formed by using the photomask of this embodiment, a positive type photoresist is generally used as the material of the micro lenses, which are the optical element array.

In formation of the micro lenses, the resist is exposed by using an area coverage modulation mask. Therefore, the contrast of the resist is lower than general photoresist. In FIG. 1B4, the portion corresponding to the portion from the point 143 to the point 144 does not contribute to light condensation, a shape as steep as possible needs to be employed to reduce the width. By reducing the width, the shape of the portion from the point 144 to the point 145 which contributes to light condensation may be made closer to the shape corresponding to the portion from the point 114 to the point 115 in FIG. 1B1.

Even in the case where the photoresist for micro lenses having a low contrast is employed, the desirable shape which is equivalent to the design shape can be achieved by using this method. An aspherical micro lens will be described with reference to FIG. 11.

Figure 11:
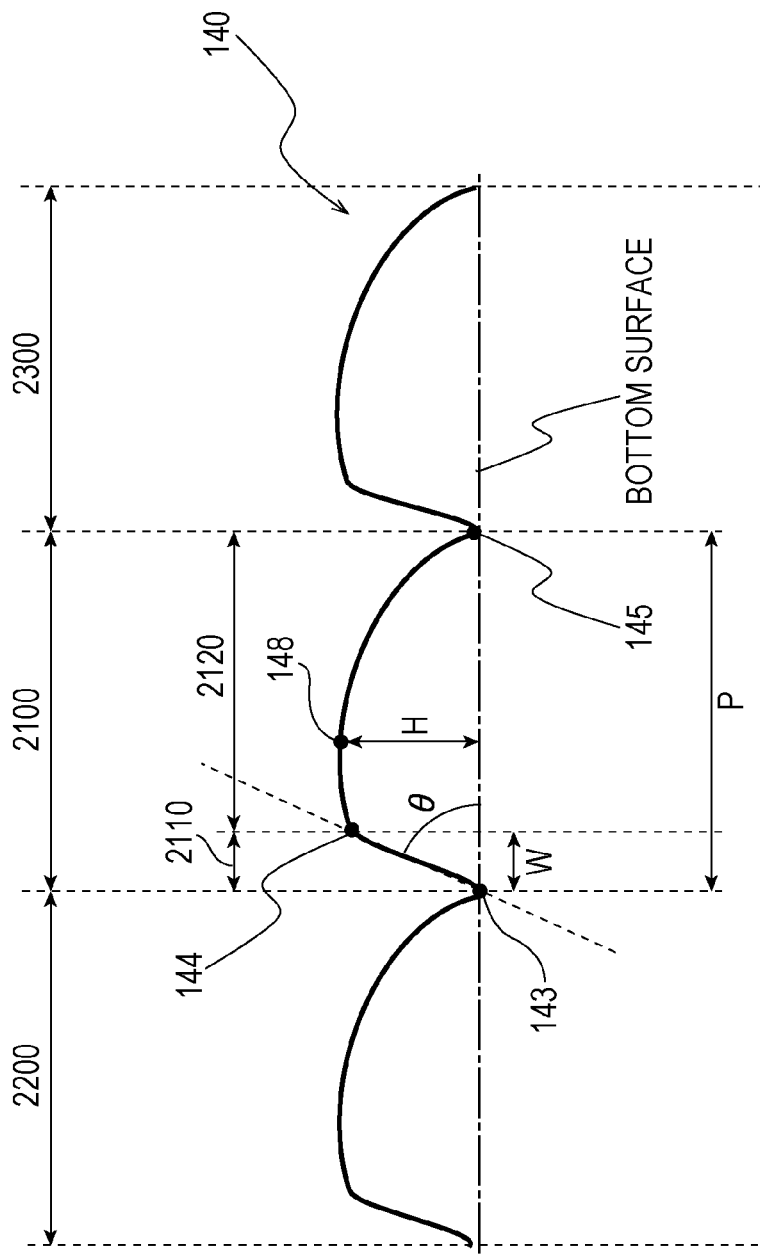
FIG. 11 is a drawing for explaining the optical elements of this disclosure.

FIG. 11 is a drawing corresponding to FIG. 1B4. However, a description of the optical elements may be given with expressions different from expressions used in drawings other than FIG. 11. Reference numeral 2100 is an area in which the first optical element is formed, reference numeral 2200 is an area in which the second optical element is formed, and reference numeral 2300 is an area in which the third optical element is formed. These optical elements are arranged in the X-axis direction (the first direction) and have bottom surfaces in the X-axis direction. The second optical element is arranged so as to abut on the first optical element. The third optical element is arranged so as to abut on the first optical element on the side opposite to the side on which the second optical element is provided.

FIG. 11 is a cross-sectional view taken along the first direction, and figuring out the form in this manner may be expressed as "in the cross-sectional view taken along the first direction".

In the cross-sectional view taken along the first direction, the first optical element includes a first area 2110 having a steep change in surface shape of the first optical element and a second area 2120 having a relatively gentle change in surface shape of the first optical element. A boundary between the first area 2110 and the second area 2120 is a point 144. A boundary between the area 2100 in which the first optical element is formed and the area 2200 in which the second optical element is formed is the point 143. In the first direction, the distance between the boundaries, that is, the distance from the point 143 to the point 144 is defined as W. The distance W corresponds to a width of an area of the micro lens as the first optical element having a steep surface shape as the first optical element.

A distance from the apex 148 to the bottom surface of the first optical element in a direction (Y-axis direction) orthogonal to the first direction is defined as H. The distance H corresponds to the height of the micro lens as the first optical element.

A distance of the area 2100 in which the first optical element is formed in the first direction is defined as P. The distance P corresponds to a pitch of formation of a plurality of optical elements.

In addition, an angle formed between a straight line connecting the point 143 and the point 144 and the bottom surface is θ.

Here, the distance W of the manufactured micro lens (the width of the area of the micro lens, having a steep surface shape) and the distance H (the height of the micro lens) satisfy a relationship 0.3H<W<0.5H. In addition, the angle θ satisfies a relationship 2<tan$^{-1}$θ<3.5.

For example, the manufactured micro lens has an angle θ of 70°, a height H of 1 μm, and a width W of a steep area is 0.4 μm.

In order to achieve efficient light condensation of oblique incident light, the pitch P and the distance W are set to satisfy the relationship W<⅓·P.

By designing the third area 103 illustrated in FIG. 1B1 adequately, a structure in which the optical element and the optical element abutting thereon is reduced, that is, a gapless structure is achieved. The width of the area 103 at this time is such that the dimension of the third area 103 illustrated in FIG. 1B1 falls between 1/10 times to 1 time, and specifically, between ½ times to 1 time the wavelength of light used in exposure.

Second Embodiment

In the first embodiment, the case of the optical element array 100 in which a plurality of optical elements are one dimensionally arranged has been described. However, in a second embodiment, a case where the plurality of optical elements are arranged two-dimensionally will be described. FIG. 5A is a schematic plan view corresponding to FIG. 1A and, in this embodiment, a plurality of optical elements 11 to 19 are arranged two-dimensionally. FIG. 5B2 and FIG. 5B4 illustrate light transmission rates and shapes of cross sections taken along the line VB-VB in FIG. 5A, and are equivalent to FIG. 1B2 and FIG. 1B4. FIG. 5C1 to FIG. 5C4 illustrate a design shape 1510, a light transmission rate distribution 1520, a light intensity distribution 1530, and a shape 1540 of a cross section taken along the line VC-VC in FIG. 5A, respectively.

As illustrated in FIG. 5C1, in the design shape 1510 of the optical elements 12, 14, and 15, the optical elements are in contact with optical elements abutting each other at the same height. In such a case, in the light transmission rate distribution 1520 illustrated in FIG. 5C2, provision of portions such as areas 103 in FIG. 5B2 is not necessary. In FIG. 5C2, the light transmission rate distribution 1520 of the optical elements abutting each other has a line symmetrical shape including the contact point between the optical elements abutting each other. In contrast, as illustrated in FIG. 5B2, in the contact point between the optical elements abutting each other in the case where the light transmission rate distribution 120 has a non-line-symmetry shape including the contact point at the contact point between the optical elements abutting each other, the areas 103 are provided. With such a configuration, optical elements with high degree of reproducibility with respect to the shape at the time of designing are provided.

Third Embodiment

A third embodiment is different from the first embodiment in that the plurality of optical elements are arranged two-dimensionally, and a gap is provided between a certain optical element and another optical element abutting thereon in the X-axis direction. The third embodiment is different from the second embodiment in that a gap is provided between a certain optical element and another optical element abutting thereon in the X-axis direction. FIG. 6A to FIG. 6C4 correspond to FIG. 1A to FIG. 1C4, and to FIG. 5A to FIG. 5C4. FIG. 6A is a schematic plan view illustrating nine optical elements 61 to 69. A gap 605 provided between the optical elements abutting each other is a hatched portion illustrated between the optical element 61 and the optical element 62, for example. In this configuration as well, a photomask like the first and second embodiments can be designed. Focusing on the optical element 61 and the optical element 62, a shape of the optical element and a light transmission rate of the photomask will be described.

A design shape 610 illustrated in FIG. 6B1 has a constant height between a point 611 and a point 612, and the height increases from the point 612 to a point 613. The height of the design shape 610 increases from the point 613 to a point 614, and becomes constant again between the point 614 and a point 615. The height of the design shape 610 decreases from the point 615 to a point 616, and decreases from the point 616 to a point 617, and becomes constant again between the point 617 to a point 618. A portion between the point 611 and the point 612, a portion between the point 614 and the point 615, and a portion between the point 617 and the point 618 are portion corresponding to the gap. A point 619 is the highest portion, and is an apex of the cross section thereof.

A light transmission rate distribution 620 illustrated in FIG. 6B2 corresponds to the design shape 610, and includes a first area 601, a second area 602, and a third area 603 in the same manner as FIG. 1B2. The height of the light transmission rate distribution 620 is constant between a point 621 and a point 622, and as illustrated by the point 622 and a point 623, the height increases at the point 622 (an inclination of the light transmission rate distribution 620 is zero). The height of the light transmission rate distribution 620 decreases from the point 623 to a point 624, and becomes constant again between the point 624 and a point 625. The height of the light transmission rate distribution 620 increases from the point 625 to a point 626 (an inclination of the light transmission rate distribution 620 is zero), and decreases from the point 626 to a point 627, and becomes constant again between the point 627 to a point 628. A portion between the point 621 and the point 622, a portion between the point 624 and the point 625, and a portion between the point 627 and the point 628 are portions corresponding to the gap. The point 629 is a portion having the highest light transmission rate, and corresponds to the point 619 in FIG. 6B1.

The light transmission rate distribution 620 includes the first area 601 from the point 623 to the point 624, the second area 602 from the point 626 to the point 627, and the third area 603 from the point 624 to the point 625. In the same manner as the first embodiment, the light transmission rate of the third area 603 has a light transmission rate higher than the segment between the point 624 and the point 626. In this embodiment, the width of the third area 603 is designed to be wider than the width of the third area 103 of the first embodiment. By forming the photomask having the light transmission rate distribution as described above, a light intensity distribution 630 having point 631 to point 639 as illustrated in FIG. 6B3 is obtained and a shape 640 having point 641 to point 649 as illustrated in FIG. 6B4 is obtained. With the photomask configured as described above, optical elements having the shape 640 with high degree of reproducibility with respect to the design shape 610 in FIG. 6B1 are obtained.

A design shape 1610, a light transmission rate distribution 1620, a light intensity distribution 1630, and a shape 1640 illustrated in FIG. 6C1 to FIG. 6C4 have the same shape and distribution as those in FIG. 5C1 to FIG. 5C4, and hence the description will be omitted. Although a plurality of optical elements are arranged two dimensionally in the third embodiment, one dimensional arrangement is also applicable.

Fourth Embodiment

A fourth embodiment is different from the first embodiment in the shape of the optical element in plan view. FIG. 7A to FIG. 7C4 correspond to FIG. 1A to FIG. 1C4. FIG. 7A is a schematic plan view illustrating three optical elements 71 to 73. Description will be given the plan view of the optical elements of this embodiment, while focusing attention on the optical element 71.

As illustrated in FIG. 7A, the optical element 71 includes a point 501 closer to the center of the optical element array and a point 502 positioned farther from the center than the point 501 along the X-direction in plan view. The optical element 71 is line symmetry with respect to a segment connecting the point 501 and the point 502, and has a point 505 where an apex is located on the segment connecting the point 501 and the point 502. The optical element 71 has the point 503 and the point 504. A segment connecting the point 503 and the point 504 has the widest part of the optical element 71 in the Y-direction. The optical element 71 has a shape having a curvature from the point 502 to the point 501 and from the point 503 to the point 501 in plan view.

In this configuration as well, a photomask like other embodiments can be designed.

A cross sectional shape taken along the line VIIB-VIIB and the line VIIC-VIIC in FIG. 7A is equal to the cross-sectional shape taken along the line VIIB-VIIB and the line VIIC-VIIC in FIG. 1A. Therefore, FIG. 7B1 to FIG. 7C4 are equal to FIG. 1B1 to FIG. 1C4. Therefore, detailed description of FIG. 7B1 to FIG. 7C4 will be omitted. The points 111, 113, and 118 of FIG. 7B1 are points corresponding to the points 501, 502 and 505 in FIG. 7A.

Fifth Embodiment

A fifth embodiment is different from the first to fourth embodiments in that the optical element has a prism structure. In this embodiment, the case where the optical elements having the prism structure are arranged one-dimensionally will be described. FIG. 8A is a drawing illustrating a design shape 810 of the cross section of the optical element array as that illustrated in FIG. 1B1. FIG. 8B illustrates a light transmission rate distribution 820 as that illustrated in FIG. 1B2.

The design shape 810 in FIG. 8A illustrates one cross section of the three optical elements. The design shape 810 will be described below by focusing on the two optical elements. The height of the design shape 810 increases linearly from a point 811 to a point 812 and decreases linearly from the point 812 to a point 813. The height then increases again linearly from the point 813 to a point 814. The height of the design shape 810 decreases linearly from the point 814 to a point 815. The points 812 and 814 are the highest portions, and are apexes of the cross section of the design shape 810. A change rate from the point 812 to the point 813 and from the point 814 to the point 815 is smaller than a change rate from the point 811 to the point 812 and from the point 813 to the point 814.

A light transmission rate distribution 820 illustrated in FIG. 8B corresponds to the design shape 810, and includes a first area 801, a second area 802, and a third area 803 in the same manner as FIG. 1B2. The height of the light transmission rate distribution 820 is constant between a point 821 and a point 822, and as illustrated by the point 822 and a point 823, the height increases at the point 822. The height of the light transmission rate distribution 820 decreases linearly from the point 823 to a point 824, and becomes constant again between the point 824 and a point 825. The height of the light transmission rate distribution 820 increases at the point 825 as indicated from the point 825 to a point 826, and decreases from the point 826 to a point 827. The points 823 and 806 are portions having the lowest light transmission rate. A change rate from a point 802 to a point 803 and from a point 805 to a point 806 is larger than a change rate from the point 803 to a point 804 and from the point 806 to a point 807.

The light transmission rate distribution 820 includes the first area 801 from the point 823 to the point 824, the second area 802 from the point 826 to the point 827, and the third area 803 from the point 824 to the point 825. In the same manner as the first embodiment, the light transmission rate of the third area 803 has a light transmission rate higher than the segment connecting the point 824 and the point 826. By forming the photomask having the light transmission rate distribution as described above, a shape having high degree of reproducibility is obtained for the design shape 810 as illustrated in FIG. 8A.

Sixth Embodiment

Figure 9A:
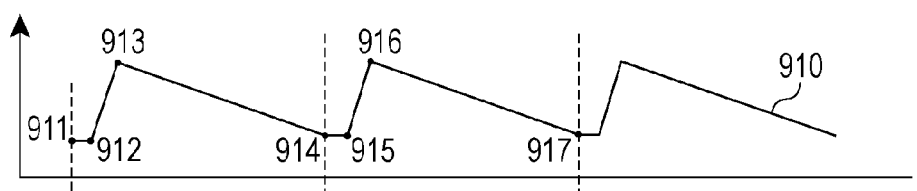
FIGS. 9A and 9B are schematic cross-sectional views of the optical element of a sixth embodiment.
Figure 9B:
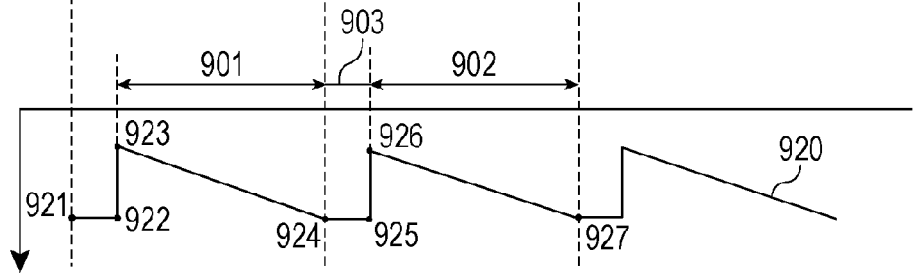

A sixth embodiment is different from the shape of the fifth embodiment in that a gap is provided between one optical element and another optical element abutting each other. FIG. 9A illustrates a design shape 910 of a cross section of an optical element array corresponding to FIG. 8A. FIG. 9B illustrates a light transmission rate distribution 920 corresponding to FIG. 8B.

The design shape 910 in FIG. 9A illustrates one cross section of the three optical elements in the same manner as FIG. 8A. The design shape 910 will be described by focusing on the two optical elements. The height of the design shape 910 is constant from a point 911 to a point 912, increases linearly from the point 912 to a point 913 and decreases linearly from the point 913 to a point 914. The height of the design shape 910 is constant from the point 914 to a point 915, increases linearly from the point 915 to a point 916 and decreases linearly from the point 916 to a point 917. The points 913 and 916 are the highest portions, and are apexes of the cross section of the design shape 910. A change rate from the point 912 to the point 913 and from the point 915 to the point 916 is smaller than a change rate from the point 913 to the point 914 and from the point 916 to the point 917.

A light transmission rate distribution 920 illustrated in FIG. 9B corresponds to the design shape 910, and includes a first area 901, a second area 902, and a third area 903 in the same manner as FIG. 8B. The light transmission rate distribution 920 has the same distribution as a portion from the point 821 to the point 827 in FIG. 8B from a point 921 to a point 927. The light transmission rate distribution 920 includes the first area 901 from the point 923 to the point 924, the second area 902 from the point 926 to the point 927, and the third area 903 from the point 924 to the point 925 in the same manner as other embodiments. In the same manner as other embodiments, the light transmission rate of the third area 903 has a light transmission rate higher than the segment connecting the point 924 and the point 926. In this embodiment, the light transmission rate distribution 920 has the third area 903 wider than the light transmission rate distribution 820 in FIG. 8B. By forming the photomask having the light transmission rate distribution as described above, a shape having high degree of reproducibility is obtained for the design shape 910 as illustrated in FIG. 9A.

Method of Forming Photoelectric Conversion Apparatus

Methods of forming a photomask formed according to the first to sixth embodiments and a method of manufacturing optical elements using the methods of forming the photomask will be described with reference to FIG. 10. Here, the method of manufacturing the optical element in a photoelectric conversion apparatus as illustrated in FIG. 1D of the first embodiment will be described. FIG. 10 is a drawing schematically illustrating a cross section of the photoelectric conversion apparatus in a given manufacturing process.

First of all, a photomask is manufactured by using a photomask manufacturing system. The photomask manufacturing system includes an information processing apparatus, an inspection apparatus, and a defect correcting apparatus. The information processing apparatus creates photomask pattern data on the basis of acquired various data. In addition, the information processing apparatus converts the created photomask pattern data to drawing data corresponding to the drawing apparatus. The drawing apparatus manufactures a photomask by a reduction transfer method or a direct drawing method on the basis of the drawing data manufactured by the information processing apparatus. The inspection apparatus inspects defects of the photomask, and check whether or not a dot pattern is formed as designed. An inspection method is not specifically limited although there are various methods. For example, a method that compares the photomask patter data with an electric signal of an optical image of the photomask for inspection may be employed. The defect correcting apparatus corrects defects detected by the inspection apparatus. A correcting method includes various methods, and is not limited to a specific method. However, for example, a laser beam method or an ion beam method may be employed. Here, the photomask pattern data is design data for drawing the photomask pattern with the drawing apparatus. The drawing data is data obtained by converting the photomask pattern into a data format corresponding to the drawing apparatus.

First of all, in the information processing apparatus, the shape of the optical element illustrated in the first to sixth embodiments is determined, and a light transmission rate distribution data is acquired by using a known method. Here, the light transmission rate distribution data having a first portion and a second portion corresponding respectively to two optical elements abutting each other is created. In this embodiment, in the created light transmission rate distribution data, a process of replacing the light transmission rates of part of the first portion and the second portion to the light transmission rate described in other embodiments is performed. For example, the light transmission rate of the portion including a boundary between the first portion and the second portion is replaced by a third portion including part of the first portion on a boundary side and part of the second portion on the boundary side. Part of the remaining first portion corresponds to the first area in other embodiments, part of a remaining second portion corresponds to a second area in other embodiments, and the third portion corresponds to a third area in other embodiments. A binarization process is performed on the light transmission rate distribution data having the first to third area to determine an arrangement pattern of a light-shielding member and create the photomask pattern data. Drawing data is created on the basis of the photomask pattern data, and then the light-shielding member such as chrome on a substrate by the drawing apparatus, whereby the photomask is formed.

Figure 10A:
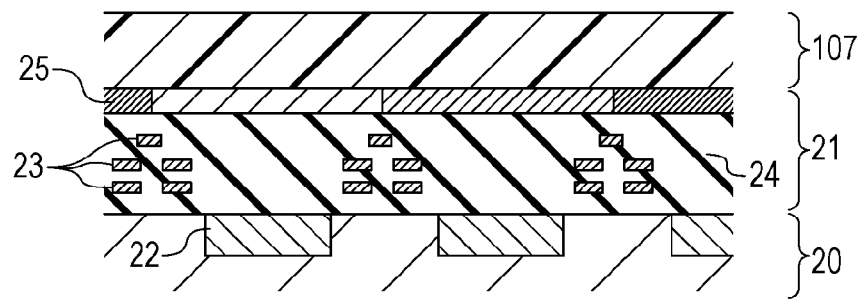
FIGS. 10A to 10O are drawings for explaining a method of manufacturing a photoelectric conversion apparatus using the optical elements of the first embodiment.
Figure 10B:
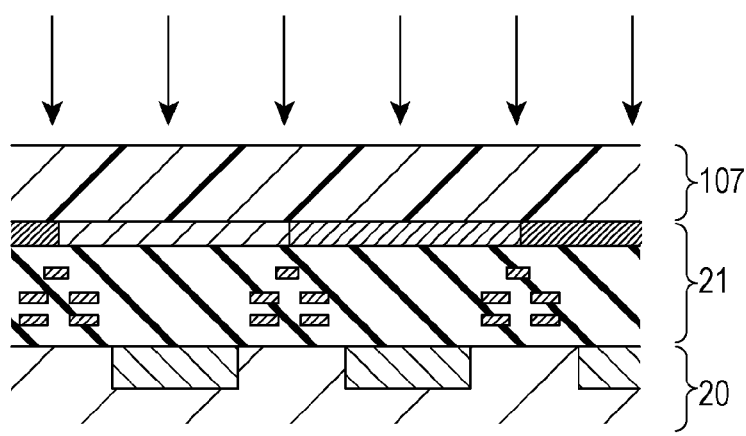
Figure 10C:
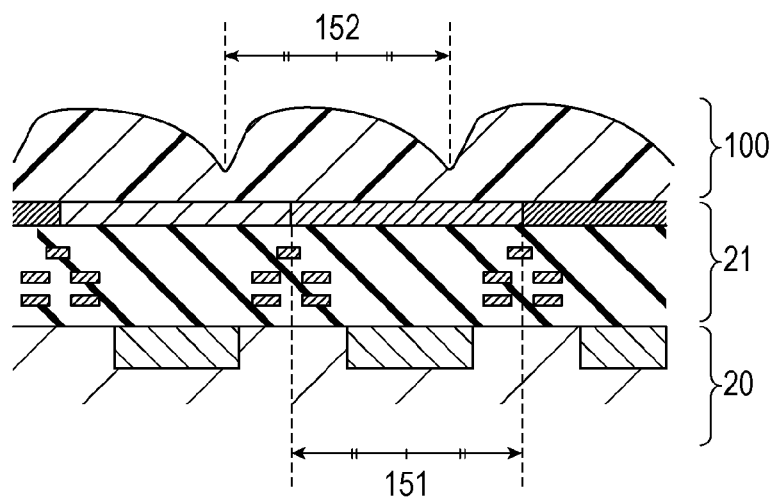

In the process illustrated in FIG. 10A, a semiconductor substrate 20 on which elements such as a photoelectric conversion element 22 and transistors are formed is prepared. An intermediated layer 21 is formed on the semiconductor substrate 20. The intermediated layer 21 includes a plurality of insulating layers 24 and a plurality of wiring layers 23, and includes a color filter layer 25 formed on the plurality of insulating layers 24. Methods of manufacturing these layers may be manufactured by a general semiconductor technology, and hence description will be omitted. Subsequently, a photoresist layer 107, which becomes the optical elements later, is formed on the color filter layer 25. The photoresist layer 107 is, for example, a positive type photoresist, and may be formed by a spin coat method. The photoresist layer 107 corresponds to an exposed member.

Subsequently, the photomask having the light transmission rate distribution illustrated in FIG. 1B2 and FIG. 1C2 is prepared, and the photoresist layer 107 is exposed via the photomask. Here, as illustrated in FIG. 1D, the position of the photomask is adjusted so that a center 152 of the optical element and a center 151 of a pixel 150 are offset.

After exposure, a development process for the photoresist layer 107 and a heat process for stabilization are performed, so that an optical element array 100 illustrated in FIG. 100 is formed.

In the case of forming the optical elements which do not have a hemispherical shape, thermal deformation at the time of heat process needs to be suppressed as much as possible. In order to suppress the thermal deformation, it is recommended to perform as a heat process a first heat process within a temperature which does not cause the thermal deformation, and a second heat process at a temperature higher than the first heat process. A heat resistance of a photoresist material is improved by the heat process as described above, and the thermal deformation is suppressed. The heat process for restraining deformation which may be employed includes an UV cure process in addition to the method described above.

Advantageous Effects of Invention

According to this disclosure, an optical element having a desired shape is obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-115281, filed Jun. 3, 2014 and Japanese Patent Application No. 2015-086265, filed Apr. 20, 2015, which are hereby incorporated by reference herein in their entirety.

What is claimed is:

1. A photomask for an optical element array comprising:
a first optical element having a bottom surface on a first surface including a first direction and a second direction that intersects the first direction; and
a second optical element having a bottom surface on the first surface and arranged so as to abut on the first optical element along the first direction,
wherein a light transmission rate distribution of the photomask along the first direction includes a first area in which the first optical element is to be formed, a second area in which the second optical element is to be formed, and a third area provided between the first area and the second area,
wherein the light transmission rate distribution of the photomask along the first direction includes:
a first light transmission rate at an end portion of the first area;
a second light transmission rate having a light transmission rate higher than the first light transmission rate at another end portion of the first area, which corresponds to a boundary between the first area and the third area on a side opposite to the end portion;
a third light transmission rate at an end portion, which corresponds to a boundary between the second area and the third area; and
a fourth light transmission rate having a light transmission rate higher than the third light transmission rate at another end portion of the second area on a side opposite to the end portion, and
wherein the light transmission rate distribution of the photomask along the first direction includes: the light transmission rate higher than a segment of light transmission rate connecting the second light transmission rate and the third light transmission rate in the third area.

2. The photomask according to claim 1, wherein
the light transmission rate distribution of the photomask along the first direction has a constant value along the first direction in the third area.

3. The photomask according to claim 1, wherein
the light transmission rate distribution of the photomask along the first direction includes: the light transmission rate increasing from the third light transmission rate to the fourth light transmission rate in the third area between an end on the first area side and an end on the second area side at a constant rate.

4. The photomask according to claim 1, wherein
the light transmission rate distribution of the photomask along the first direction includes: the light transmission rate increasing from the first light transmission rate to the second light transmission rate between an end of the first area and another end of the first area at a constant rate, and the light transmission rate increasing from the third light transmission rate to the fourth light transmission rate between another end of the second area side and the one end of the second area at a constant rate.

5. The photomask according to claim 1, wherein
the third area is shorter than the first area and the second area in the first direction.

6. A method of manufacturing an optical element array comprising:
forming the optical element array by exposing by using the photomask according to claim 1.

7. A method of manufacturing a photoelectric conversion apparatus comprising:
preparing a substrate having a plurality of photoelectric conversion elements;
forming a photosensitive member on the substrate; and
forming the optical element array on the substrate by exposing photoelectric conversion elements by using the photomask according to claim 1.

8. A method of designing a photomask pattern data for an optical element array including a first optical element having a bottom surface on a first surface including a first direction and a second direction that intersects the first direction; and a second optical element having the bottom surface on the first surface and arranged so as to abut on the first optical element along the first direction, comprising:
acquiring design shapes of the first optical element and the second optical element;
acquiring a light transmission rate distribution of the photomask pattern data for the photomask having a first portion corresponding to the first optical element and a second portion corresponding to the second optical element from design shapes of the first optical element and the second optical element;
replacing a boundary between the first portion and the second portion, part of the first portion on the boundary side and part of the second portion on the boundary side with a third portion in the light transmission rate distribution; and
forming the photomask pattern data based on the light transmission rate distribution after the replacing with the third portion,
wherein the third portion has a first light transmission rate at the boundary with respect to the first portion and a second light transmission rate at the boundary with respect to the second portion, and
wherein the light transmission rate distribution in the third portion has a light transmission rate higher than a segment of light transmission rate connecting a light transmission rate at the boundary with respect to the first portion and a light transmission rate at the boundary with respect to the second portion.

9. A method of manufacturing a photomask comprising:
forming photomask pattern data by using a method of designing a photomask pattern data according to claim 8; and
manufacturing a photomask by using the photomask pattern data.

10. An optical element array having a plurality of optical elements comprising:
first optical elements arranged along a first direction and having bottom surfaces in the first direction;
second optical elements arranged along the first direction, having bottom surfaces in the first direction, and arranged so as to abut on the first optical elements; and
third optical elements arranged along the first direction, having bottom surfaces in the first direction, and arranged so as to abut on the first optical elements on an opposite side to a position where the second optical elements are arranged,
wherein the first optical elements include:
a first area which does not include an apex of a first optical element and in which a change of a surface shape of the first optical element is steep,
a second area which includes an apex of the first optical element and in which a change of the surface shape of the first optical element is gentle in cross-sectional view along the first direction, and
a distance W between a boundary between the first area and the second area and a boundary between an area in which the first optical element is formed and an area in which a second optical element is formed in the first direction and a distance H between the apex and the bottom surface of the first optical element in a direction orthogonal to the first direction satisfies a relationship $0.3H<W<0.5H$.

11. The optical element array according to claim 10, wherein an angle θ formed between a straight line connecting the boundary between the first area and the second area and the boundary between the area in which the first optical element is formed and the area in which the second optical element is formed and the bottom surface has a relationship $2<\tan^{-1}\theta<3.5$.

12. The optical element array according to claim 10, wherein a pitch P in which the plurality of optical elements are formed and the distance W satisfies a relationship $W<\frac{1}{3}\cdot P$.

* * * * *